(12) United States Patent
Chen et al.

(10) Patent No.: US 7,569,465 B2
(45) Date of Patent: Aug. 4, 2009

(54) USE OF VOIDS BETWEEN ELEMENTS IN SEMICONDUCTOR STRUCTURES FOR ISOLATION

(75) Inventors: Jian Chen, San Jose, CA (US); Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 204 days.

(21) Appl. No.: 11/210,218

(22) Filed: Aug. 22, 2005

(65) Prior Publication Data
US 2006/0001073 A1 Jan. 5, 2006

Related U.S. Application Data

(62) Division of application No. 10/443,502, filed on May 21, 2003, now Pat. No. 7,045,849.

(51) Int. Cl.
*H01L 21/336* (2006.01)
*H01L 21/469* (2006.01)

(52) U.S. Cl. .................. 438/588; 438/257; 438/587; 438/619; 257/E21.422

(58) Field of Classification Search ......... 257/314–326; 438/257–267, 587–588, 592–594, 619
See application file for complete search history.

(56) References Cited

U.S. PATENT DOCUMENTS

| | | | |
|---|---|---|---|
| 4,892,753 A | 1/1990 | Wang et al. |
| 5,043,940 A | 8/1991 | Harari |
| 5,070,032 A | 12/1991 | Yuan et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,712,180 A | 1/1998 | Guterman et al. |
| 5,734,607 A | 3/1998 | Sung et al. |
| 5,774,397 A | 6/1998 | Endoh et al. |
| 5,867,429 A | 2/1999 | Chen et al. |

(Continued)

FOREIGN PATENT DOCUMENTS

CN 1791974 A 6/2006

(Continued)

OTHER PUBLICATIONS

Peters, Laura "Are Air Gaps Coming sooner Than We Think?", Semiconductor International, www.reed-electronics.com/semiconductor/index.asp?layout=articlePrint&articleID=CA307349, Jul. 1, 2003, 2 pages.

(Continued)

*Primary Examiner*—Douglas M Menz
*Assistant Examiner*—Matthew W Such
(74) *Attorney, Agent, or Firm*—Davis Wright Tremaine LLP (57) ABSTRACT

A flash EEPROM or other type of memory cell array having adjacent charge storage elements is formed with a gas filled void between them in order to reduce the level of capacitive coupling between storage elements, thus reducing cross-coupling between charge storage elements and resulting errors occurring in the data read from the array.

9 Claims, 4 Drawing Sheets

U.S. PATENT DOCUMENTS

| | | | |
|---|---|---|---|
| 5,869,379 | A | 2/1999 | Gardner et al. |
| 6,013,584 | A | 1/2000 | M'Saad |
| 6,046,935 | A | 4/2000 | Takeuchi et al. |
| 6,057,224 | A | 5/2000 | Bothra et al. |
| 6,103,573 | A | 8/2000 | Harari et al. |
| 6,106,678 | A | 8/2000 | Shufflebotham et al. |
| 6,110,793 | A | 8/2000 | Lee et al. |
| 6,136,687 | A | 10/2000 | Lee et al. |
| 6,151,248 | A | 11/2000 | Harari et al. |
| 6,190,981 | B1 | 2/2001 | Lin et al. |
| 6,222,762 | B1 | 4/2001 | Guterman et al. |
| 6,235,354 | B1 * | 5/2001 | Lee et al. .................... 427/534 |
| 6,281,075 | B1 | 8/2001 | Yuan et al. |
| 6,303,464 | B1 | 10/2001 | Gaw et al. |
| 6,335,288 | B1 | 1/2002 | Kwan et al. |
| 6,350,672 | B1 | 2/2002 | Sun |
| 6,413,827 | B2 | 7/2002 | Farrar |
| 6,469,339 | B1 | 10/2002 | Onakado et al. |
| 6,629,425 | B2 * | 10/2003 | Vaiyapuri .................. 62/259.2 |
| 6,720,612 | B2 | 4/2004 | Takeuchi et al. |
| 7,045,849 | B2 | 5/2006 | Chen et al. |
| 2001/0003379 | A1 | 6/2001 | Seo |
| 2003/0006448 | A1 | 1/2003 | Mehrad et al. |
| 2003/0109093 | A1 | 6/2003 | Harari et al. |
| 2003/0151069 | A1 * | 8/2003 | Sugimae et al. ............. 257/200 |

FOREIGN PATENT DOCUMENTS

| | | |
|---|---|---|
| WO | WO 02/07213 A1 | 1/2002 |

OTHER PUBLICATIONS

Lee, Jae-Duk et al., "Effects of Parasitic Capacitance on NAND Flash Memory Cell Operation", IEEE Non-Volatile Semiconductor Memory Workshop, Aug. 12-16, 2001, Monterey, CA, pp. 90-92.

Lee, Jae-Duk et al., "Effects of Floating-Gate Interference on NAND Flash Memory Cell Operation", IEEE Electron Device Letters, vol. 25, No. 5, May 2002.

Qian, L.Q., et al., "High Density Plasma Deposition and Deep Submicron Gap Fill With Low Dielectric Constatn SiOF Films", DUMIC Conference, Feb. 21-22, 1995, pp. 50-56.

Lee, B., et al., "Dielectric Planarization Techniques for Narrow Pitch Multilevel Interconnects", V-MIC Conference, Jun. 15-16, 1987, pp. 85-92.

Nozaki, Takaaki et al., "A 1-Mb EEPROM with MONOS Memory Cell for Semiconductor Disk Application", IEEE Journal of Solid-State Circuits, vol. 26, No. 4, Apr. 1991, pp. 497-501.

Eitan, Boaz et al., "NROM: A Novel Localized Trapping, 2-Bit Nonvolatile Memory Cell", IEEE Electron Device Letters, vol. 21, No. 11, Nov. 2000, pp. 543-545.

Chan, T.Y. et al., "A True Single-Transistor Oxide-Nitride-Oxide EEPROM Device", IEEE Electron Device Letters, vol. EDL-8, No. 3, Mar. 1987, pp. 93-95.

EPO/ISA, "Notification of Transmittal of the International Search Report and the Written Opinion of the International Searching Authority, or the Declaration", Dec. 10, 2004, mailed in corresponding PCT/US2004/013986, 13 pages.

The Patent Office of the People's Republic of China, "Office Action," corresponding Chinese Patent Application No. 20048001399.1 on Feb. 9, 2007, 14 pages.

The Patent Office of the People's Republic of China, "Office Action," corresponding Chinese Patent Application No. 20048001399.1 on Sep. 7, 2007, 7 pages.

Kynett et al., "An In-System Reprogrammable 256K CMOS Flash Memory," IEEE International Solid-State Circuits Conference, Feb. 1988, p. 132-133.

Third Office Action, Chinese Application No. 200480013991.1, dated Mar. 6, 2008, 2 pages.

* cited by examiner

FIG._1

(SECTION A-A)
FIG._2A

(SECTION B-B)
FIG._2B

USE OF VOIDS BETWEEN ELEMENTS IN SEMICONDUCTOR STRUCTURES FOR ISOLATION

This application is a divisional of application Ser. No. 10/443,502, filed May 21, 2003, now U.S. Pat. No. 7,045,849, which application is incorporated herein in its entirety by this reference.

BACKGROUND

This invention relates generally to the isolation of tightly packed elements in semiconductor structures, and, more specifically, to the electric field isolation of neighboring charge storage elements of non-volatile flash electrically erasable and programmable read-only-memory (flash EEPROM) cell arrays.

In a first category of flash memory array architectures, memory cells are connected between adjacent bit line source and drain diffusions that extend in a column direction with control gates connected to word lines extending along rows of cells. One common memory cell has a "split-channel" between source and drain diffusions. A charge storage element of the cell is positioned over one portion of the channel and the word line (also referred to as a control gate) is positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. The word line extends over a row of charge storage elements. Examples of such cells, their uses in memory systems and methods of manufacturing them are given in U.S. Pat. Nos. 5,070,032, 5,095,344, 5,315,541, 5,343,063, 5,661,053, and 6,281,075.

A modification of this split-channel flash EEPROM cell adds a steering gate positioned between the charge storage element and the word line. Each steering gate of an array extends over one column of charge storage elements, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762.

Another type of memory array in this category that has been used commercially for many years uses an ETOX™ cell attributed to Intel Corporation. Individual memory cells are connected between a common source and shared drain lines. An early article describing this type of memory cell and array by Kynett V. N., Baker A., Fandrich M., Hoekstra G., Jungroth O., Kreifels J. and Wells S. is titled "An In-system Reprogrammable 256 K CMOS Flash Memory", *ISSCC Conf. Proc.*, (1988) p. 132.

In a second category of flash memory array architectures, generally referred to as NAND arrays, series strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in U.S. Pat. Nos. 5,570,315, 5,774,397 and 6,046,935.

Increasing Data Storage Density

As in most all integrated circuit applications, the pressure to shrink the silicon substrate area required to implement some integrated circuit function also exists with flash EEPROM arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by defining more than two threshold levels as storage states for each storage element transistor, four such states (2 bits of data per storage element) now being included in commercial products. More storage states, such as 8 states (3 data bits) and 16 states (4 data bits) per storage element, are contemplated. Each storage element memory transistor has a certain total range (window) of threshold voltages in which it may practically be operated, and that range is divided into the number of states defined for it plus margins between the states to allow for them to be clearly differentiated from one another. A multiple state flash EEPROM structure and operation is described in U.S. Pat. Nos. 5,043,940 and 5,172,338, for example.

Another type of memory cell includes two storage elements that may also be operated in multiple states on each storage element. In this type of cell, two storage elements are included over its channel between source and drain diffusions with a select transistor in between them. A steering gate is included along each column of storage elements and a word line is provided thereover along each row of storage elements. When accessing a given storage element for reading or programming, the steering gate over the other storage element of the cell containing the storage element of interest is raised sufficiently high to turn on the channel under the other storage element no matter what charge level exists on it. This effectively eliminates the other storage element as a factor in reading or programming the storage element of interest in the same memory cell. For example, the amount of current flowing through the cell, which can be used to read its state, is then a function of the amount of charge on the storage element of interest but not of the other storage element in the same cell. Examples of this cell array architecture and operating techniques are described in U.S. Pat. Nos. 5,712,180, 6,103,573 and 6,151,248.

Charge Storage Elements

The charge storage elements of current flash EEPROM arrays and discussed in the foregoing referenced patents and articles are most commonly electrically conductive floating gates, typically formed from doped polysilicon material. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS. Memory Cell for Semiconductor Disk Application,". *IEEE Journal of Solid-State Circuits*, Vol. 26, No. 4, April 1991, pp. 497-501, which describes a similar cell in a split-gate configuration where a doped polysilicon gate extends over a portion of the memory cell channel to form a separate select transistor.

Another approach to storing two bits in each cell utilizing a dielectric storage medium has been described by Eitan et al., "NROM: A Novel Localized Trapping, 2-Bit Nonvolatile. Memory. Cell," *IEEE Electron Device Letters*, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric.

The use of dielectric charge storage media in NOR, NAND and other flash EEPROM architectures is further described in pending U.S. application Ser. No. 10/280,352, filed Oct. 25, 2002 by Harari et al., and entitled "Multi-State Non-Volatile Integrated Circuit Memory Systems that Employ Dielectric. Storage Elements".

Interaction Between Neighboring Charge Storage Elements

As the number of states stored in each memory cell increases, the tolerance of any shifts in the programmed charge level on the storage elements decreases. Since the ranges of charge designated for each storage state must necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with that cell, such as those in the same column or row, and those sharing a line or node.

In addition, apparent shifts in the stored charge levels occur because of field coupling between storage elements. The degree of this coupling necessarily increases as the spaces between memory cell storage elements are decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with that the first group. This is known as the "Yupin" effect, and is described in U.S. Pat. No. 5,867,429.

The effect of this parasitic capacitance between storage elements can be compensated by taking into account the effect of the charge on the second group of storage elements when reading that of the first group. Also, the effect may be reduced by physically isolating the two groups of storage elements from each other, such as by placing a conductive shield between the two groups. One way in which such shielding has been accomplished is to extend control gate lines, which run across either rows or columns of floating gates, downward between the floating gates. Further, it has been suggested that the parasitic capacitance between floating gates may be reduced by positioning a dielectric material between them, either in a solid or a non-solid form, which has a very low dielectric constant, but of course not less than 1.0. Another technique to reduce coupling between floating gates is to make them very thin so that their opposing surface areas are small.

SUMMARY OF THE INVENTION

Isolation between adjacent charge storage elements is provided by forming a dielectric between them that contains a void extending a major part of the distance between the elements instead of the usual technique of making the dielectric solid throughout the entire space between charge storage elements. The void will usually contain the gas present in the processing chamber when the dielectric is formed. Such a gas has a dielectric constant of 1.0 or only a small amount above 1.0, depending upon its exact composition. This is considerably less than that of commonly used dielectric materials such as silicon dioxide, with a dielectric constant of about 4.0, depending upon the exact composition and method of formation, and silicon nitride with a dielectric constant of about 7.5. A significant reduction in the coupling between adjacent charge storage elements is thus achieved.

In one embodiment, this isolation is formed in spaces between floating gates at the bottom of stacks of layers having a height of five, eight or more times the width of the spaces between the stacks. The other layers in the stacks usually contain at least one dielectric and a conductive control gate line. This 5:1, 8:1 or more cross-sectional aspect ratio of the spaces between the stacks allows a dielectric to be formed that extends downward into the spaces along sidewalls of the stacks but not filling the bottom segments of the spaces between the charge storage elements. Top portions of the spaces are filled with the dielectric, however, thereby leaving large voids sealed in the dielectric between the charge storage elements.

These isolation techniques are applied to a wide variety of non-volatile memory cell arrays, such as those within the two categories described in the Background. In a specific NAND array, for example, control gate (word) lines extend over rows of floating gates and down between them, thereby providing shielding along the rows as well as desirably increasing the coupling between each of the word lines and the floating gates in its row. The dielectric with voids is then formed between the rows in order to reduce capacitive coupling between floating gates along the columns (i.e., along NAND strings of floating gate transistors). Another example use of the isolation techniques herein is with an ETOX™ array having alternate source and drain implants in one direction across the array, between which the individual charge floating gates are positioned. Although a conductor usually extends between the floating gates to contact every other implant region along each row of memory cells, and thus provide some shielding between the floating gates on either side of the conductor, the alternate spaces between floating gates over the remaining implant regions are very small. The dielectric with voids is used in these small spaces instead of the usual solid dielectric such as silicon dioxide.

Additional aspects, advantages and features of the present invention are included in the following description of exemplary examples thereof, which description should be taken in conjunction with the accompanying drawings.

DETAILED DESCRIPTION OF EXEMPLARY EMBODIMENTS

Figure 1:
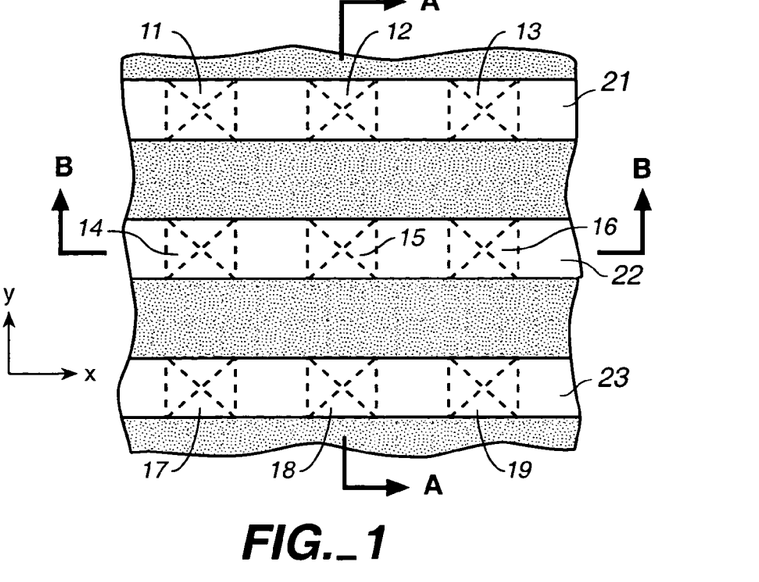
FIG. 1 is a plan view representation of a portion of a memory cell array according to one embodiment of the present invention.

Referring initially to FIG. 1, a plan view of the primary elements of a portion of a memory cell array is first described, and this plan view is then used as a reference for the cross-sectional views of FIGS. 2A-4, which show the array's structure at various stages of its formation. Conductive floating gate charge storage elements 11-19 are regularly spaced in a two-dimensional x-y pattern across a semiconductor substrate surface, with a layer of gate dielectric therebetween. Control gate lines 21-23 are elongated in the x-direction across the array and spaced apart in the orthogonal y-direction to individually extend across and be aligned with a line of floating gates, with a layer of dielectric between them. The lines of floating gates extending in the x-direction are referenced in this example as rows of floating gates, and the lines of floating gates extending in the y-direction are referenced as columns. The control gate lines 21-23 can be, for example, word lines of the array. A combination of dielectric material and voids is positioned between the rows of floating gates and the control gate lines, as best described with respect to the cross-sectional view of FIGS. 2A-4.

Figure 2A:
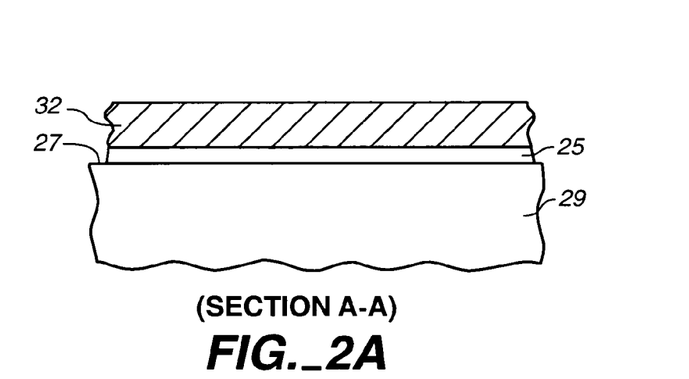
FIGS. 2A and 2B are cross-sectional views of the array of FIG. 1, taken at respective orthogonal sections A-A and B-B thereof, when in a preliminary stage of processing.
Figure 2B:
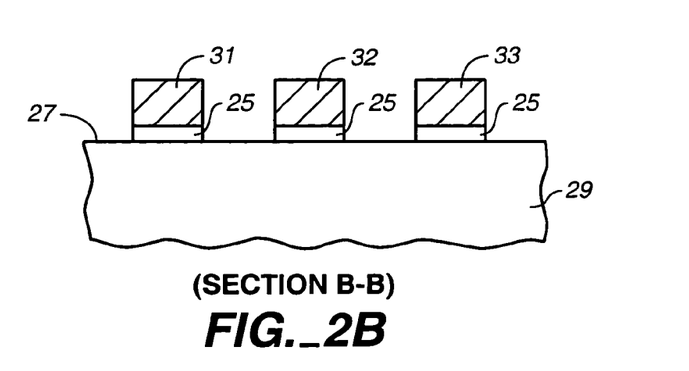

FIGS. 2A and 2B show the result of a few initial steps in processing, in sections extending in the y-direction and x-direction, respectively, across the array of FIG. 1. A gate dielectric layer 25 is first formed on a surface 27 of a semiconductor substrate 29 over the substrate area occupied by the array. The layer 25 may be silicon dioxide grown on the surface 27 to a thickness of about 90 Angstroms. A layer of polysilicon is then deposited across the dielectric layer 25 from which the isolated floating gates are formed. The thickness of this polysilicon layer may be about 1500 Angstroms. The polysilicon may be conductively doped either as part of the deposition process or after deposition by ion implantation. Initially, this polysilicon layer is separated by an etching step into strips 31-33 having lengths extending in the y-direction, and with widths and spacing in the x-direction that are preferably a minimum that the process being used will allow.

Figure 3A:
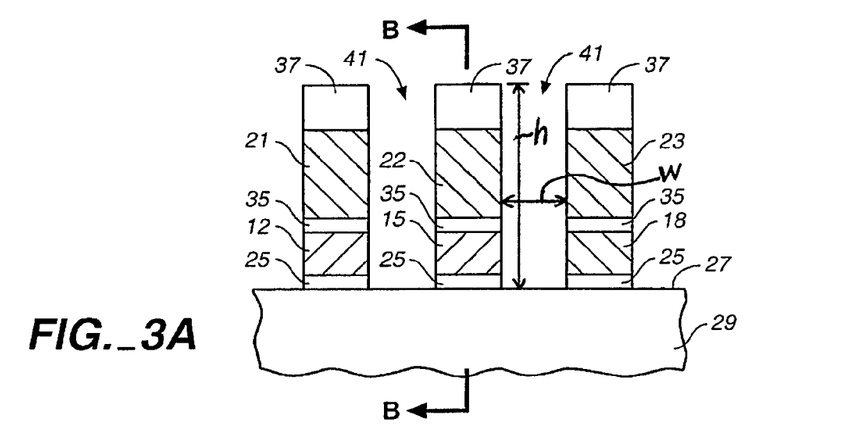
FIGS. 3A and 3B are cross-sectional views of the array of FIG. 1, taken at respective sections A-A and B-B thereof, at an intermediate stage in its formation.
Figure 3B:
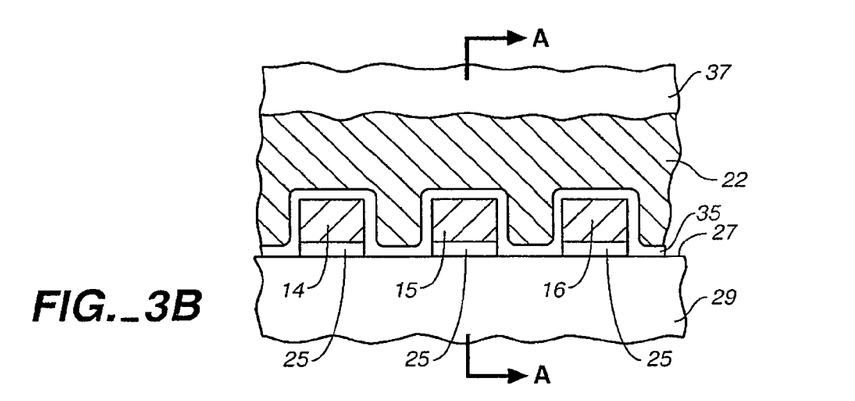

A next series of steps is illustrated by the cross-sectional views of FIGS. 3A and 3B. A layer 35 of dielectric is formed over the area of the array, over exposed surfaces of the doped polysilicon strips 31-33 and substrate surface areas therebetween. This dielectric is preferably formed of a composite layer of silicon dioxide, silicon nitride and silicon dioxide, commonly known as ONO. Its thickness may be about 160 Angstroms, as an example. A next step is to form a second layer of doped polysilicon, or a combination of doped polysilicon and a top portion of a metal such as tungsten, over the dielectric layer 35 in the area of the array, with a thickness that may be in a range of about 3000-4000 Angstroms. On top of this polysilicon or polysilicon/metal layer is then formed a rather thick layer 37 of dielectric, over the area of the array, preferably silicon nitride with a thickness in a range of about 2500-3000 Angstroms.

Next, the combination of the layers of ONO 35, second polysilicon or polysilicon/metal and silicon nitride 37 are etched through a mask (not shown) formed on top of the layer 37 to form strips of all three layers that are elongated in the x-direction and spaced apart in the y-direction. The second doped polysilicon or polysilicon/metal layer is separated by this step into the control gate lines 21-23. The widths and spacing of these strips are also preferably made to be about a minimum that is practical with the processing being used. After the three-layer composite strips are so formed, they, particularly the top silicon nitride layer 37, are used as a mask to etch away exposed portions of the first doped polysilicon layer strips 31-33 between them, thereby separating these first polysilicon strips into the individual floating gates 11-19. The result is a series of self-aligned stacks, as best illustrated in FIG. 3A, of gate dielectric 25, one of the floating gates 12, 15 or 18, an inter-polysilicon layer 35, one of conductive gate lines 21, 22 or 23, and a dielectric 37.

The widths of these composite strips in the y-direction may be about 1400 Angstroms and the space "w" between them in the y-direction about 1200 Angstroms, in a specific example using current state-of-the art processing technology. The height or thickness "h" of the self-aligned stacks, summing the thicknesses of the individual layers given in the specific example above, is between 7250 and 8750 Angstroms. Spaces 41 (FIG. 3A) between these stacks in the y-direction then have an aspect ratio (height h divided by width w, in cross-section) of from 6.0 to 7.3. The aspect ratio will increase as a result of process improvements allowing the shrinking of horizontal dimensions across the substrate causing the widths of the spaces 41 to be reduced without the height of the stacks forming the spaces necessarily being changed. The aspect ratio is also controlled, independent of the process resolution element size, by controlling the heights of the stacks without affecting operation of the resulting array, particularly by controlling the thickness of the top dielectric layer 37 or another dielectric layer that may be added on top of it. Aspect ratios of up to 12, 15 or more are contemplated.

Typically, the spaces 41 would be completely filled with silicon dioxide or other suitable solid dielectric. A considerable amount of effort has been directed over the years to develop techniques for filling small spaces with silicon dioxide without leaving any voids or pockets in the solid dielectric material. United States patents describing this effort include U.S. Pat. Nos. 4,892,753, 6,013,584, 6,106,678, 6,110,793 and 6,335,288. Technical articles on this subject include Lee et al. "Dielectric Planarization Techniques For Narrow Pitch Multilevel Interconnects", *VMIC Conference*, June 1987, pp. 85-92, and Qian et al., "High Density Plasma Deposition and Deep Sub-micron Gap Fill with Low Dielectric Constant SiOF Films", *California DUMIC Conference*, Feb. 1995, pp. 50-56.

Figure 4:
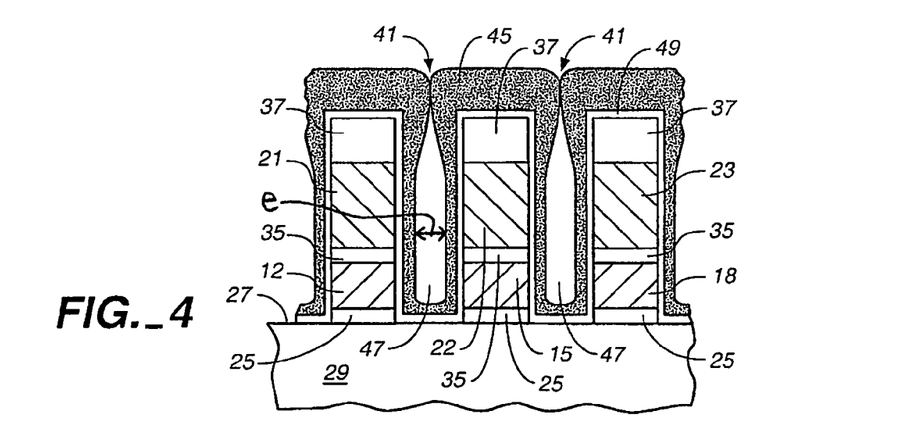
FIG. 4 is a cross-sectional view of the array of FIG. 1, taken at section A-A thereof, when in the stage of processing shown.

But in the process being described, as illustrated in the cross-sectional view of FIG. 4, a dielectric layer 45 is formed, for example by depositing silicon dioxide, which closes off the top of the spaces 41 but does not completely fill in the spaces. Rather, the dielectric is intentionally deposited in a manner to leave voids 47. The voids 47 occupy a majority of the width of the spaces 41 at least along the heights of the floating gates on opposite sides of the spaces, except to the extent, if any, that the dielectric formed on the bottoms of the spaces under the voids 47 is thicker than the gate dielectric layers 25. Prior to depositing the dielectric layer 45, a thin layer 49 of silicon dioxide may optionally be grown over the exposed surfaces of the stacks and spaces between them.

The dielectric layer 45 can be formed with voids 47 by depositing an oxide with lower pressures and temperatures than are normally used to deposit oxide layers, such as in a low-pressure chemical-vapor-deposition (CVD) process. Many different combinations of starting gasses, pressures, temperatures and times may be used to form the layer 45 of silicon dioxide to include the voids 47, and are usually dependent upon the particular deposition equipment being used. By way of illustration, a process carried out in a plasma enhanced CVD deposition chamber causes silane ($SiH_4$) and oxygen ($O_2$) gases to react in the chamber to f-form the layer 45 of silicon dioxide ($SiO_2$) with the voids 47. Physical vapor deposition (PVD) techniques can alternatively be employed, including sputtering within a vacuum chamber from of a target of silicon dioxide, to deposit a silicon dioxide film, or a target of silicon nitride ($Si_3Ni_4$) to deposit a silicon nitride film.

The voids 47 are initially filled with whatever gas or gasses are present in the deposition chamber when forming the dielectric layer 45. Such gasses typically have a dielectric constant close to that of air, namely close to 1.0. But since the material of the layer 45 is generally porous, these gases are usually replaced over time with other ambient gases, such as air, in which the wafers are placed after the deposition and before the top of the layer 45 is sealed by further processing steps. The result is a desired low level of capacitive coupling between each pair of floating gates on opposite sides of one of the spaces 41. Since silicon dioxide typically has a dielectric constant of about 4.0 and silicon nitride around 7.5, use of either of these materials makes it desirable that the voids 47 occupy as much of the width of the spaces 41 as practical and extend over as much of the vertical floating gate surface areas bordering the spaces 41 as possible. In FIG. 4, the width "e" of the voids 47 in the y-direction is one-half or more of the width w of the spaces 41 in the region of the opposing floating gates, such as between floating gates 12 and 15. Even when materials having a dielectric constant less that those of silicon dioxide and silicon nitride are used, it is desirable to maintain this relative width of the voids.

In addition to forming the voids 47 as part of the process of depositing the dielectric layer 45, isolation between adjacent floating gates can be further increased by use of a dielectric material for the layer 45 that has a lower dielectric constant than those of silicon dioxide or silicon nitride. An example is fluorinated silicon oxide (SiOF) that may be deposited by plasma enhanced CVD or high density plasma CVD by reacting silane and one of $SiF_4$, $CF_4$ or $NF_3$ within the vacuum processing chamber. The material SiOF has a dielectric constant within a range of about 2.2 to 3.2.

In the exemplary memory cell array of FIGS. 1-4, the voids 47 contribute significantly to minimizing field coupling between adjacent rows of floating gates in a very small-scale memory cell array, and thus minimizes the influence of the level of charge of one floating gate on the state read from memory cells in adjacent rows. Isolation between memory cells along the same row (between columns of memory cells) is provided by the control gate lines extending downward between adjacent floating gates, thus shielding them from one other. This is best shown in FIG. 3B, wherein the control gate line 22 extends downward between adjacent floating gates 14 and 15, between floating gates 15 and 16, and so on.

Figure 5:
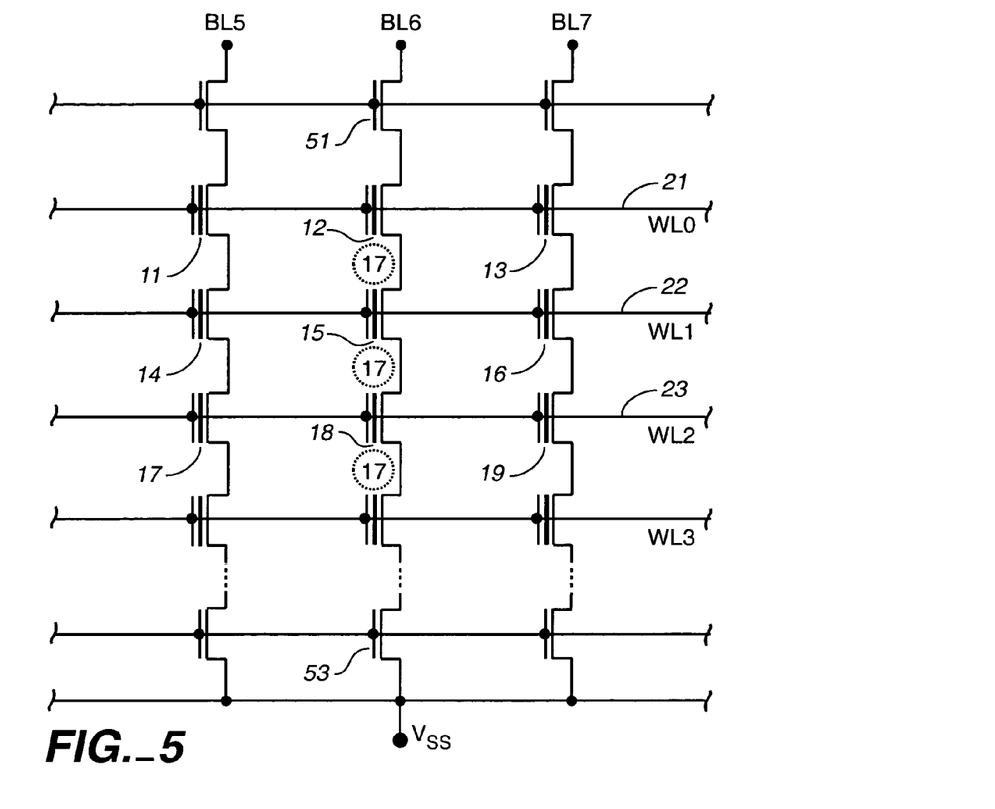
FIG. 5 is an equivalent electrical circuit of a portion of the memory cell array shown in FIGS. 1-4.

The techniques described herein for isolating adjacent floating gates can be applied to a variety of memory cell array architectures. For example, an equivalent circuit of a portion of a NAND array is shown in FIG. 5, with elements common to those of FIGS. 1-4 being identified by the same reference number. In this case, the memory cells in each column are electrically connected together in series by implanting isolated source and drain regions (not shown) between the floating gates in the column, FIGS. 3A and 4 show cross-sectional views of one of the columns. These implants can be made at a convenient point in the processing described above, such as when in the intermediate structural state of FIGS. 3A and 3B. The stacks of floating and control gates can serve as a portion of an implant mask, confining the implants in the y-direction to regions of the substrate surface 27 between them. In the case of a NAND array, the control gate lines 21-23 are word lines of the array, each extending in the x-direction across a row of one memory cell in each of a large number of such NAND columnar series strings of memory cells. Each columnar string of series connected memory cells in FIG. 5 includes a pair of select transistors at each end of the string, such as transistors 51 and 53 for one of the strings of FIG. 5. The string is connected through transistor 53 to a common voltage $V_{SS}$ such as ground, and through transistor 51 to an individual bit line BL6.

The same techniques are used to advantage in the first category of flash memory cell arrays discussed above in the Background. For example, the control gate lines 21-23 can be steering gates and source/drain regions can be formed in continuous lengths in the x-direction along the substrate surface 27 in spaces between the steering gates the y-direction. Word lines can also be added with lengths extending in the y-direction over the steering gates and coupled with certain regions of the substrate surface 27. In a specific configuration, the source and drain regions are formed in every other space between steering gates in the y-direction, these spaces then being filled with the dielectric layer 45 and voids 47, as described. In the remaining alternate spaces between steering gates, the word lines extend downward into these spaces and are coupled through a dielectric layer with the substrate surface 27 to form select transistors that are part of the memory cells. In such a cell, two floating gate transistors and an intermediate select transistor are connected in series in the y-direction between adjacent source/drain regions that are elongated in the x-direction.

Figure 6:
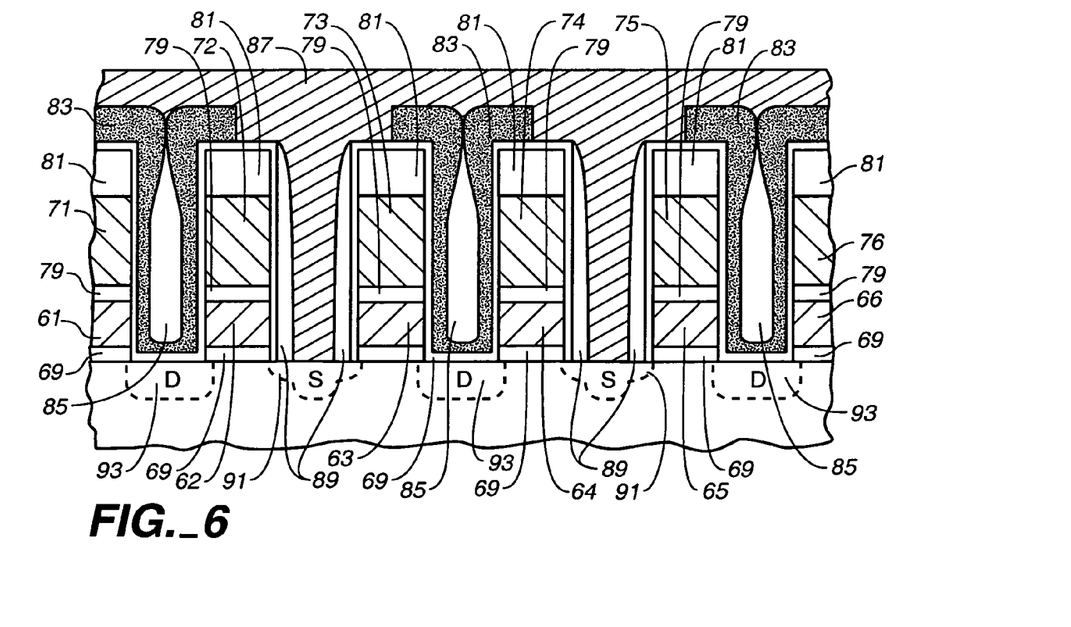
FIG. 6 is a cross-sectional view of an array according to a second embodiment of the present invention.
Figure 7:
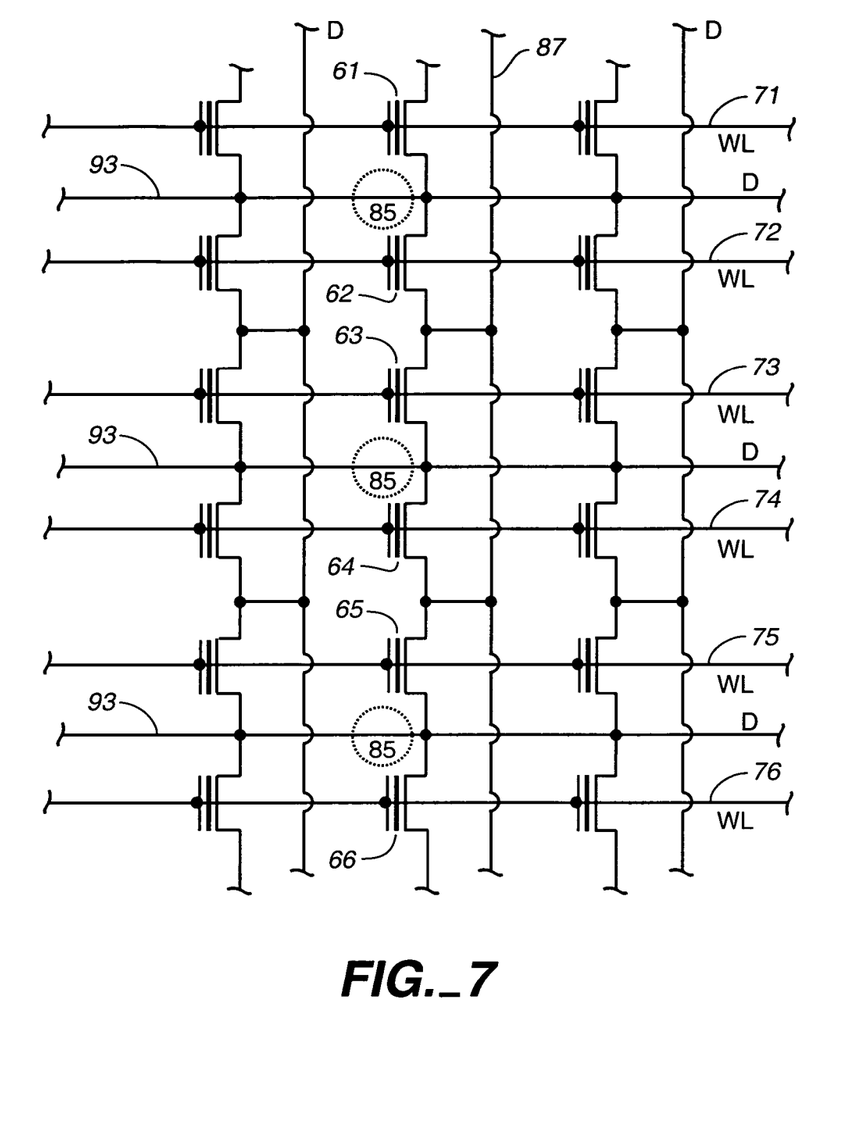
FIG. 7 is an equivalent electrical circuit of a portion of an array of memory cells of the type shown in FIG. 6.

Application of the isolation techniques of the present invention to an ETOX™ memory cell array is illustrated in the cross-sectional view in FIG. 6 along a column of a few memory cells. Floating gates 61-66 are positioned across a surface of a semiconductor substrate with a layer 69 of gate oxide therebetween. Control gates 71-76, in this case word lines, are positioned over respective ones of the floating gates 61-66 with a dielectric layer 79 therebetween, and are elongated along rows of memory cells, across a large number of such columns. Thick dielectric regions 81 are formed over the control gates. Source regions 91 and drain regions 93, implanted into the substrate surface, alternate along the column of cells.

At a point in the processing when the stacks of floating gates, control gates and associated dielectric regions are formed, a layer 83 of dielectric is deposited in the manner described above with respect to FIG. 4 for dielectric layer 45. Voids 85, having the same characteristics described above for the voids 47, are formed. But rather than placing the dielectric 83 and a void 47 in each space between adjacent floating gates, they appear in every other such space over drain regions 93. This is because the common source regions 91 are contacted by a conductor 87 that extends along the column, and thus this conductor fills those alternate spaces between sidewall spacers 89. The spaces between the gate stacks that include material of the conductor 87 are necessarily wider than those containing the dielectric 83 and voids 85. The adjacent floating gates on opposite sides of the spaces containing the dielectric 83 and voids 85 are not shielded and are close enough to have a high level of capacitive coupling if the voids 85 were not present. Since floating gates in adjacent columns can also be shielded, by extending the word lines down between them (not shown), use of the dielectric 83 and voids 85 reduces the coupling between the remaining sets of unshielded floating gates.

Although the various aspects of the present invention have been described with respect to exemplary embodiments thereof, it will be understood that the present invention is entitled to protection within the full scope of the appended claims. Further, each of the patents, patent applications, articles and other publications referenced in this document are expressly incorporated herein in their entirety.

It is claimed:

1. A method of making a non-volatile memory, comprising:
    forming an array of charge storage elements on a surface of a semiconductor substrate with a first layer of dielectric between the charge storage elements and the surface of the semiconductor substrate,
    forming control gates elongated in a first direction over the charge storage elements with a second layer of dielectric between the control gates and the charge storage elements, the control gates being separated in a second direction across the array, the first and second directions being orthogonal with each other,
    forming a third dielectric layer over the control gates, wherein the charge storage elements, the second dielectric layer, the control gates and the third dielectric layer form layered structures with opposing sidewalls in the second direction that form spaces between the layered structures having widths in the second direction that are less than one-fifth of thicknesses of the layered structures, and further wherein the charge storage elements are positioned at bottom portions of the layered structures, and
    thereafter forming a dielectric in the spaces between the layered structure sidewalls that close tops of the spaces while leaving voids in bottom portions of the spaces between the charge storage elements in the layered structures whose opposing sidewalls formed the spaces.

2. The method of claim 1, wherein forming the dielectric in the spaces includes reacting silane with another gas within a deposition chamber.

3. The method of claim 1, wherein forming the dielectric in the spaces includes forming said dielectric in less than all the spaces along the second direction, the method further comprising forming conductive material in others of the spaces along the second direction.

4. The method of claim 1, wherein forming the dielectric in the spaces includes leaving the voids with an extent in the second direction that is one-half or more of the distance of separation of the opposing sidewalls in the second direction.

5. The method of claim 1, wherein the layered structures are formed with opposing sidewalls in the second direction that form spaces between the layered structures having widths in the second direction that are less than one-eighth a thickness of the layered structure.

6. A method of making a non-volatile memory, comprising:
    forming a first layer of dielectric across at least a memory array area of a semiconductor substrate surface,
    depositing a first layer of conductive material over the first dielectric layer,
    separating the first conductive material layer into a first set of conductive strips having lengths extending in a first direction across the memory array area and being spaced apart in a second direction thereacross, the first and second directions being orthogonal to each other,
    forming a second layer of dielectric across at least the first set of conductive strips,
    depositing a second layer of conductive material over the memory array area including over the second layer of dielectric,
    forming a third layer of dielectric material over the second layer of conductive material,
    separating the second conductive material layer and third dielectric layer into a second set of conductive strips with the third dielectric material layer thereover that have lengths extending in the second direction across the memory array area and are spaced apart in the first direction thereacross,
    removing portions of the first set of conductive strips between the second set of conductive strips forming floating gates, under the second set of conductive strips, thereby forming spaces between adjacent ones of the second set of conductive strips in the first direction that have sidewalls of a layered structure including the floating gates, second conductive strips and second and third dielectric layers, wherein heights of the layered structure exceeds five times the spaces between adjacent layered structures and the floating gates are positioned at bottom portions of the layered structures, and
    thereafter forming a dielectric within the spaces between adjacent layered structures that closes tops thereof but leaves voids in bottom portions of the spaces between the floating gates of the layered structures adjacent the spaces.

7. The method of claim 6, wherein forming the dielectric within the spaces includes reacting silane with another gas within a deposition chamber.

8. The method of claim 6, wherein forming the dielectric within the spaces includes doing so in a manner to leave voids with an extent in the first direction that is one-half or more of a dimension of the spaces between the second set of conductive strips.

9. The method of claim 6, wherein the heights of the layered structures exceeds eight times the spaces between adjacent layered structures.

* * * * *